US008248839B2

(12) United States Patent
George

(10) Patent No.: US 8,248,839 B2
(45) Date of Patent: Aug. 21, 2012

(54) ELECTRICAL, CONTROL METHOD, SYSTEM AND APPARATUS

(76) Inventor: Jonathan George, Arlington, VA (US)

( * ) Notice: Subject to any disclaimer, the term of this patent is extended or adjusted under 35 U.S.C. 154(b) by 23 days.

(21) Appl. No.: 12/903,858

(22) Filed: Oct. 13, 2010

(65) Prior Publication Data
US 2011/0084753 A1    Apr. 14, 2011

Related U.S. Application Data

(60) Provisional application No. 61/251,435, filed on Oct. 14, 2009.

(51) Int. Cl.
*G11C 11/00* (2006.01)
(52) U.S. Cl. .................. 365/148; 365/189.09
(58) Field of Classification Search .......... 365/148, 365/158, 171, 230.06, 189.06, 189.07, 189.09, 365/227, 229
See application file for complete search history.

(56) References Cited

U.S. PATENT DOCUMENTS

| | | | | | |
|---|---|---|---|---|---|
| 3,405,393 | A | * | 10/1968 | Haselwood | 375/369 |
| 5,083,117 | A | * | 1/1992 | Hoigaard | 340/649 |
| 5,377,156 | A | * | 12/1994 | Watanabe et al. | 365/227 |
| 2001/0008083 | A1 | * | 7/2001 | Brown | 73/146 |
| 2009/0315710 | A1 | * | 12/2009 | Richter | 340/540 |

* cited by examiner

*Primary Examiner* — Gene Auduong
(74) *Attorney, Agent, or Firm* — Maier & Maier, PLLC

(57) ABSTRACT

A system for addressing electrical signals is disclosed, comprising an electromagnetically conductive control element, at least one control signal, at least one electromagnetic pulse modulator associated with the control element, and a threshold element positioned proximate to the control element, having an electromagnetic resistance that is conditional and changes as a result of fluctuations in the electromagnetic field of the control element.

13 Claims, 2 Drawing Sheets

ELECTRICAL, CONTROL METHOD, SYSTEM AND APPARATUS

RELATED APPLICATIONS

The present invention claims priority under 35 U.S.C. §120 to U.S. Provisional Patent Application No. 61/251,435 filed on Oct. 14, 2009, the disclosure of which is incorporated by reference herein in its entirety.

BACKGROUND

The background for this application relates generally to the field of electronics and more specifically to the control of electrical properties over space and time, for example to their control for signaling electronic components, storing memory, and generating computation. Computation can begin as a variation of physical properties over physical space-time. Information, although arguably separate from space-time, may further dwell in space and can live in time. Without the variation of physical properties over space-time, space-time could be represented as a single state.

Presently there are several methods currently used to control the physical properties of space-time for computation. Hardware can be created by lithographically etching electrical components into the space of the silicon wafer. Software can be defined by the storage of bits of information in disparate locations across arithmetic logic units (ALUs), registers, caches, buffers, hard-disks, and networks. However, computation may eventually come down to a change in a physical property over space-time.

SUMMARY OF THE INVENTION

In one exemplary embodiment, a system for addressing electrical signals can be described. The system may include an electromagnetically conductive control element, at least one control signal, at least one electromagnetic pulse modulator associated with the control element, and a threshold element positioned proximate to the control element, having an electromagnetic resistance that is conditional and changes as a result of fluctuations in the electromagnetic field of the control element.

In another exemplary embodiment, a method of addressing electrical signals can be described. The method can include positioning a threshold element with a conditional electromagnetic resistance proximate to an electromagnetically conductive control element, transmitting a plurality of electromagnetic pulses through the control element using a pulse modulator, causing electromagnetic interference at a point on the control element by aligning the plurality of electromagnetic pulses, spiking at least one of voltage and current at the point of electromagnetic interference, modulating at least one of the electromagnetic interference and resulting voltage and current spike so that the resistance of the threshold element is changed at the point, and modifying electrical signals using the change in the resistance characteristics of the threshold element.

BRIEF DESCRIPTION OF THE FIGURES

Advantages of embodiments of the present invention will be apparent from the following detailed description of the exemplary embodiments thereof, which description should be considered in conjunction with the accompanying drawings in which.

DETAILED DESCRIPTION

Aspects of the invention are disclosed in the following description and related drawings directed to specific embodiments of the invention. Alternate embodiments may be devised without departing from the spirit or the scope of the invention. Additionally, well-known elements of exemplary embodiments of the invention will not be described in detail or will be omitted so as not to obscure the relevant details of the invention. Further, to facilitate an understanding of the description discussion of several terms used herein follows.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

Further, many embodiments are described in terms of sequences of actions to be performed by, for example, elements of a digital control system and the digital signal processing (DSP) devices. It will be recognized that various actions described herein can be performed by specific circuits (e.g., application specific integrated circuits (ASICs)), by program instructions being executed by one or more processors, or by a combination of both. Additionally, these sequences of actions and processes described herein can be considered to be embodied entirely within any form of computer platform having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such-embodiments may be described herein as, for example, "logic configured to" perform the described action.

Figure 1:
FIG. 1 is an exemplary diagram showing a device for addressing electrical signals
Figure 2:
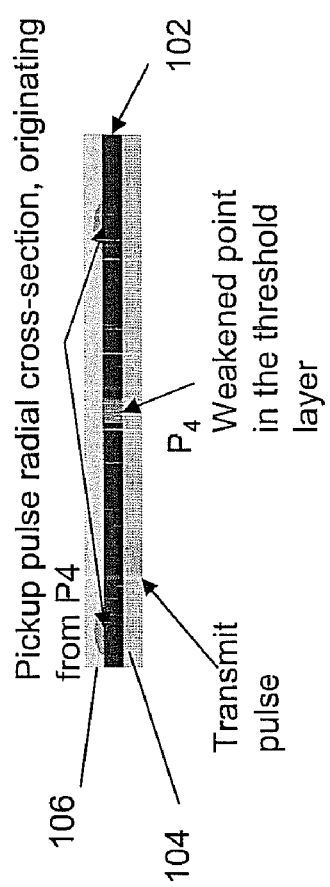
FIG. 2 is an exemplary diagram showing a device for addressing electrical signals.
Figure 3:
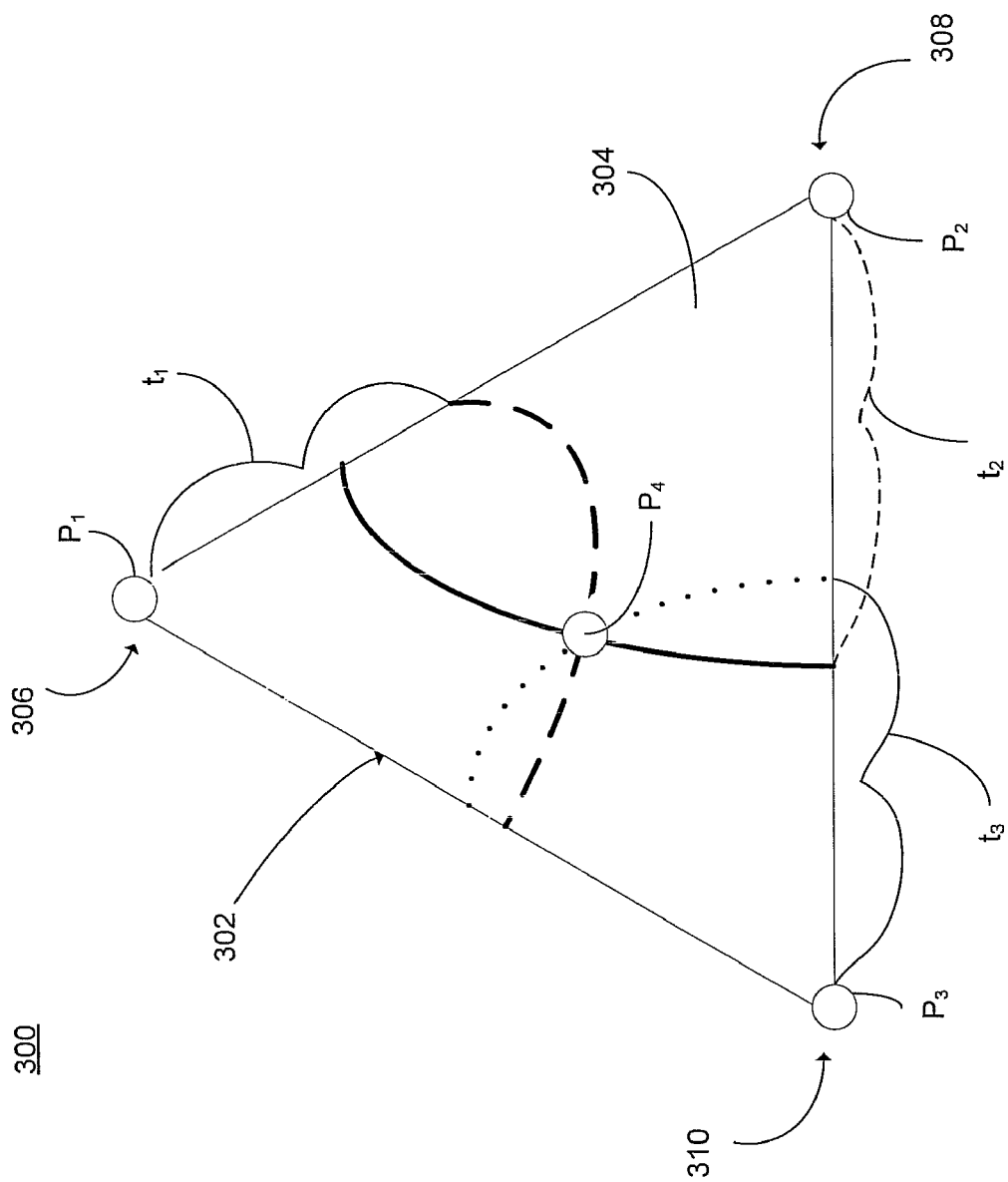
FIG. 3 is an exemplary diagram showing pulse wave fronts intersecting.

FIGS. 1-3 generally relate to apparatuses, methods and systems for addressing electrical signals in a material for the control of circuits, modification of material properties, computation and data storage. In exemplary embodiments, control over changes in a signal over time can be used to effect changes in space. For example, control of the timing of pulses may be used to control the location of pulses. In further exemplary embodiments, this control may be used to reduce complexity in computer components.

In one exemplary embodiment, and as shown in FIGS. 1 and 2, a conductive control line or element 104 may be encased or doped in a resistive, threshold layer 102. The encasement or doping may be done in any desired manner. The threshold layer 102 may be formed out of any desired material. In some examples, the threshold layer 102 may include a layer disposed thereon such that its resistance or resistive properties may be changed or broken down following an application of one or more pulses traversing a desired point or location over time.

A number of pulses, for example two pulses, may be sent through the conductive control element 104 through the use of one or more voltage or current sources. The pulses may be timed, for example through the use of one or more pulse modulators associated with the conductive control element 104. The one or more pulse modulators may time the propagation or generation of the pulses. These pulse modulators may control the timing of pulses using any method. For example, pulse timing can be controlled by splitting a single pulse into two lines and then utilizing controllable capacitors, inductors, or semiconductor elements uniquely or in conjunction with each other, or any other desired elements, to delay each pulse in a controlled manner.

Pulses may move through the conductive control element 104 and interfere at a point, for example $P_4$, in the conductive control element 104. Any interference resulting from the movement of pulses may cause wave propagation through the threshold layer 102 and further into the pickup layer 106 as well as a voltage or current spike at a location in the conductive control element 104. The location of a spike may be controlled or varied using a pulse modulator to adjust the timing of the pulses. Thus, a resulting spike may break the resistance of the threshold layer 102 to cause the pulse to traverse the threshold layer at a point in 1-space. Therefore, following the passage of time and a repeated number of pulses or, in other exemplary embodiments, pulses of higher power, a weakness may develop in a threshold layer 102. The weakness can occur at the point of interference, $P_4$, or any other location as desired by adjusting the timing of the pulses. Due to the weakness, future pulses may then move through this point more easily.

In another exemplary embodiment, and as shown as an example in FIG. 3, a two dimensional embodiment may include a conductive control plane 302 that can be covered with a threshold layer 304. Three conductive lines, 306, 308, and 310, may be attached to control plane 302 in such a manner that they are conductive to the control plane 302 in three separate locations. A number of pulses, for example three pulses, although other numbers can occur, may be generated by any number of voltage or current generators and sent through conductive lines 306, 308, and 310 to the control plane 302 at three separate locations, for example $P_1$, $P_2$ and $P_3$.

The exemplary three pulses may be sent through lines 306, 308, and 310 in such manners that the pulses interfere at a controlled location, for example $P_4$ in 2-space within the conductive control plane 302. The location of $P_4$, or any other desired or arbitrary location where any number of pulses may interfere, may be adjusted or varied by changing or alternating the timing of the pulses. In this example, $P_4$ may be controlled by time values $t_1$, $t_2$ and $t_3$. As in the above exemplary embodiments, the timing and location of pulses may be controlled by a pulse modulator associated with the conductive plane 302 and may produce any desired time values. Any interference produced may produce a spike in voltage or current. The spike in voltage or current may then cause a resultant pulse to traverse the threshold layer 304 at a point in 2-space.

In each of the exemplary embodiments described and shown herein, any originating pulses can have any wavelength. Further, the addressing resolution of a resultant pulse may be controlled as a function of both an ability of the threshold layer to resist the pulse, for example the ability to resist the pulse or have a known resistance up to a defined threshold level, and a control of timing of the originating pulses.

In all of the exemplary embodiments the conductor may be grounded in cycles between any interference of pulses. In such embodiments the pulses may contain inrush currents generated as the conductor is disconnected from sources, grounded, and then reconnected to sources. The disconnection, grounding, and reconnection of the conductor may be accomplished by changing physical contact as in a switch, by an electronic component for example a relay or transistor, or by any other technique known in the art.

In all of the exemplary embodiments described herein, any resultant pulses generated may be utilized in any of a variety of manners. For example, a resultant pulse can be used to signal any electrical components that may be placed on or along the threshold layers 102 and 304. Additionally, a resultant pulse may be used to modify any properties of any materials disposed on or along threshold layers 102 and 304.

In other exemplary embodiments, any resultant pulses may be used as a memory, such as a computer memory. This memory can be implemented by the addition of a second conductive layer on an opposite side of the threshold layers 102 and 304, respectively. As described previously, the threshold layers 102 and 304 may be formed out of any desired material or may include a layer disposed thereon to provide a desired resistance. Thus, a weakness in pulse resistance at any location in 1-space (with respect to exemplary FIG. 1-2) or 2-space (with respect to FIG. 3) may be detected by sending any number of pulses to a predetermined or desired location. Readings of the values of the pulses at the predetermined or desired location may then be read through a transmission of pulses having lesser amplitude to the predetermined or desired location. In some examples, if weaker pulses are able to traverse the threshold layer 102 or 304 they may then be detected on a second conducting layer, for example conducting layer 106 in exemplary FIGS. 1-2. These operations may then result in a bit-write and bit-read operation on the pulse resistance of the threshold layers 102 and 304.

The foregoing description and accompanying drawings illustrate the principles, preferred embodiments and modes of operation of the invention. However, the invention should not be construed as being limited to the particular embodiments discussed above. Additional variations of the embodiments discussed above will be appreciated by those skilled in the art.

Therefore, the above-described embodiments should be regarded as illustrative rather than restrictive. Accordingly, it should be appreciated that variations to those embodiments can be made by those skilled in the art without departing from the scope of the invention as defined by the following claims.

What is claimed is:

1. A system for addressing electrical signals, comprising:
   an electromagnetically conductive control element;
   at least one control signal; and
   a threshold element positioned proximate to the control element, and having an electromagnetic resistance that is conditional and changes as a result of fluctuations in the electromagnetic field of the control element,
   wherein a single electromagnetic pulse is split into one of two electromagnetic pulses that are transmitted through the control element in one dimension and three electromagnetic pulses that are transmitted through the control element in two dimensions.

2. The system of claim 1, wherein the controllable circuit elements include at least one of an inductor, capacitor, and semiconductor circuit element.

3. The system of claim 1, wherein the threshold element has an electromagnetic resistance that is changed in a localized manner by the presence and position of electromagnetic pulses in the control element.

4. The system of claim 3, wherein the changes in the resistance characteristics of the threshold element control electrical components placed proximate to the threshold element.

5. The system of claim 3, wherein the changes in the resistance characteristics of the threshold element modify the properties of a material placed proximate to the threshold element.

6. The system of claim 3, wherein the changes in the resistance characteristics of the threshold element are used as memory elements in a memory system.

7. A method of addressing electrical signals, comprising:
positioning a threshold element with a conditional electromagnetic resistance proximate to an electromagnetically conductive control element;
transmitting two electromagnetic pulses through the control element in one dimensional orientations and three electromagnetic pulses through the control element in two dimensional orientations using a pulse modulator;
causing electromagnetic interference at a point on the control element by aligning the plurality of electromagnetic pulses;
spiking at least one of voltage and current at the point of electromagnetic interference;
modulating at least one of the electromagnetic interference and resulting voltage and current spike so that the resistance of the threshold element is changed at the point; and
modifying electrical signals using the change in the resistance characteristics of the threshold element.

8. The method of claim 7, further comprising splitting a single pulse to create the two electromagnetic pulses transmitted through the control element in one dimensional situations and the three electromagnetic pulses transmitted through the control element in two dimensional situations and delaying the resulting plurality of pulses using controllable circuit elements.

9. The method of claim 7, further comprising grounding the conductor in cycles between pulses by disconnecting the conductor from the source of the pulses, grounding the conductor, and reconnecting the conductor to the source of the pulses.

10. The method of claim 9, wherein the disconnection, grounding, and reconnection is accomplished by at least one of a switch, relay, or transistor.

11. The method of claim 7, wherein the changes in the resistance characteristics of the threshold element control electrical components placed proximate to the threshold element.

12. The method of claim 7, wherein the changes in the resistance characteristics of the threshold element modify the properties of a material placed proximate to the threshold element.

13. The method of claim 7, wherein the changes in the resistance characteristics of the threshold element are used as memory elements in a memory system.

* * * * *